United States Patent [19]

Herzer et al.

[11] Patent Number: 4,722,764
[45] Date of Patent: Feb. 2, 1988

[54] METHOD FOR THE MANUFACTURE OF DISLOCATION-FREE MONOCRYSTALLINE SILICON RODS

[75] Inventors: Heinz Herzer; Wolfgang Hensel; Günter Matuszak, all of Burghausen, Fed. Rep. of Germany

[73] Assignee: Wacker-Chemitronic Gesellschaft für Elektronic-Grundstoffe mbH, Burghausen, Fed. Rep. of Germany

[21] Appl. No.: 859,210

[22] Filed: May 1, 1986

Related U.S. Application Data

[63] Continuation of Ser. No. 633,967, Jul. 24, 1984, abandoned.

[30] Foreign Application Priority Data

Sep. 20, 1983 [DE] Fed. Rep. of Germany ....... 3333960

[51] Int. Cl.$^4$ .............................................. C30B 13/16
[52] U.S. Cl. ...................... 156/620.73; 156/DIG. 64; 156/DIG. 88
[58] Field of Search ......... 156/617 SP, 620, DIG. 64, 156/DIG. 88; 75/65 ZM

[56] References Cited

U.S. PATENT DOCUMENTS

| | | | |
|---|---|---|---|
| 3,416,898 | 12/1968 | Shiroki et al. | 156/620 |
| 3,442,823 | 5/1969 | Müller et al. | 156/620 |
| 4,200,621 | 4/1980 | Liaw et al. | 156/617 SP |
| 4,239,585 | 12/1980 | Köhl | 156/618 |
| 4,270,972 | 6/1981 | Crouse | 156/620 |
| 4,436,578 | 3/1984 | Keller et al. | 156/620 |

OTHER PUBLICATIONS

E. Buehler, Contribution to the Floating Zone Refining of Silicon, vol. 28, No. 6, Jun. 1957, pp. 453–460.

Primary Examiner—David L. Lacey
Attorney, Agent, or Firm—Collard, Roe & Galgano

[57] ABSTRACT

A method for crucible-free zone pulling of silicon monocrystalline rods is described. According to the invention, a polycrystalline silicon rod obtained by crucible pulling according to the Czochralski procedure is used in lieu of the polycrystalline silicon rod produced by vapor deposition.

6 Claims, No Drawings

METHOD FOR THE MANUFACTURE OF DISLOCATION-FREE MONOCRYSTALLINE SILICON RODS

This application is a continuation of application Ser. No. 633,967, filed on July 24, 1984, now abandoned.

The invention relates to a method for the manufacture of dislocation-free monocrystalline silicon rods by a crucible-free zone pulling.

Two methods for changing polycrystalline silicon, which, for example, is obtained by vapor deposition of trichlorosilane on heated carrier elements, into monocrystalline silicon, have achieved particular significance.

In the crucible pulling process according to Czochralski, the polycrystalline material is comminuted, melted in quartz crucibles, and finally a single crystal is pulled or drawn from the melt following initial seeding. Because of the unavoidable reaction between the melt and the wall of the crucible, the dislocation-free monocrystals so obtained always contain a considerable amount of oxygen in the crystal lattice (compare, for example, DE-OS No. 27 58 888 or U.S. Pat. No. 4,239,585). The crystals so produced are therefore preferably used in microelectronics.

In the crucible-free floating or float zone process, the polycrystalline material in the form of a supply rod is melted in a narrow zone, for example, by means of an induction coil. Following seeding, this molten zone is guided along and through the rod and, following passage of the zone, the so-melted silicon recrystallizes in monocrystalline form. Material pulled or drawn through the zone contains a significantly lower proportion of oxygen with respect to a crucible-pulled material, and has a higher specific resistance with an advantageous axial variation of the resistance; it is therefore particularly suitable for use in power devices or elements.

However, dislocation-free monocrystalline rods cannot be manufactured from polycrystalline material by a single floating zone pass, as is described in DE-AS No. 20 12 086, but can only be manufactured by means of at least two floating zone passes or steps, which are correspondingly time consuming; in particular, the first melting step of the polycrystalline silicon is difficult, because of the non-uniform melting behavior (forming so-called "noses" or "peaks", compare DE-OS No. 28 12 216). For this reason, the polycrystalline rods must be formed by vapor deposition under certain conditions and must furthermore be ground to a suitable size with a concomitant loss of material.

It is therefore an object of the invention to provide an improved method for manufacturing dislocation-free monocrystalline silicon rods.

It is a more particular object of the invention to provide such a method which permits the manufacture of silicon rods having larger diameters in a relatively shorter time, and which affords greater yields in a simpler manner compared to that of the prior art by performing a floating zone process on a polycrystalline supply rod.

This object is attained by a method which is characterized by a crucible-pulled polycrystalline silicon rod being used as a supply rod.

Basically, silicon in any form is suitable as a starting material for the crucible pulling of the supply rod, to the extent it has the necessary purity. In general, one will have recourse to available polycrystalline silicon obtainable by vapor deposition of trichlorosilane on heated carrier elements made, for example, from silicon or graphite foil. An advantage with respect to the conventional zone pulling process is that, based on favorable melting properties, certain qualities of the polycrystalline material are not required. For instance, a precise maintenance of certain deposition conditions is not absolutely required so that, for example, even rapidly vapor-deposited silicon can be used, which is not suitable for the first melting pass or step employed in the usual floating zone process. Similarly, for example, waste pieces of zone-pulled rods can be used (however, one must still, of course, take into account their doping), so that the utilization of the material is improved.

The actual crucible pulling process, in which the available polycrystalline silicon is melted and is then pulled or drawn into a rod, is accomplished in a conventional manner known to those skilled in the art. A comprehensive discussion can be found, for example, in the article "Czochralski-Grown Silicon" by W. Zulehner and D. Huber, which appeared in "Crystals", Vol. 8, (1982), Springer-Verlag, Berlin-Heidelberg-New York. There the manufacture of monocrystalline rods, but also of polycrystalline rods which mostly are suitable for so-called "optical" silicon, is explained in detail.

Such polycrystalline rods can be obtained, for example, by crucible pulling, if a polycrystalline seed crystal is used or, in the case where dislocations are not removed, for example, by so-called "necking", by use of a monocrystalline seed crystal. Since during the pulling process it is only necessary to be careful as far as constancy of diameter, one need not be concerned with freedom from dislocations, monocrystallinity and the like. Also, high drawing speeds of up to 3.5 mm/min., and preferably 1.5 to 2.5 mm/min. can be reached.

The polycrystalline rod is advantageously pulled or drawn at a diameter which deviates from the desired monocrystalline and dislocation-free zone pulled crystal as little as possible, and at most by about 20%. If the deviations are larger which is fundamentally possible, it is usually more difficult to adapt the quantities of the melting and recrystallizing silicon to each other by following or leading away, respectively, of the corresponding rod portions.

The polycrystalline rod is advantageously pulled or drawn in such a manner that an annular bulge is obtained on its end, with the aid of which it can be attached to a holder provided therefor for the subsequent floating zone procedure.

The polycrystalline rod exhibits an advantageous melting behavior if it does not have any monocrystalline regions which are too large in cross section. It is therefore advantageous to strive to reduce the surfaces of the individual regions appearing in the rod cross section, and recognizable as monocrystalline regions such that they amount to less than about one third of the entire cross-sectional surface. For example, polycrystalline rods having a diameter of 100 mm can be melted in a trouble-free manner, if their cross-sectional surface is substantially composed of monocrystalline regions having a surface area of from 1 to 400 mm$^2$.

Subsequent to the crucible pulling process, the so-obtained polycrystalline silicon rod is subjected in a manner known and familiar to those skilled in the art to the floating zone process (compare, for example, W. Dietze, W. Keller, A. Mühlbauer, "Float Zone Grown Silicon", in "Crystals", Vol. 5, (1981), Springer-Verlag, Berlin-Heidelberg-New York).

In an advantageous embodiment of the inventive process, the polycrystalline rod which serves as the supply rod is provided with an annular bulge on one end thereof which, in turn, is attached to the upper pulling shaft of a conventional floating zone device. Following addition of the seed crystal, a monocrystalline rod of the desired diameter is pulled in one floating zone pass or step under a protective gas atmosphere at a pressure of preferably 1.4 to 2.5 bar; as protective gases there are suitable, for example, argon or hydrogen, used either singly or in admixture. Basically, the method can also be accomplished at normal pressure.

In this process, the oxygen largely contained in the supply rod is degassed as silicon monoxide, so that a product having a remaining oxygen content of typically less than $1 \times 10^{16}$ atoms/cm$^3$, similar to conventionally floating zoned silicon, is obtained.

By the addition of a doping gas, the preferably undoped supply rod can be doped during the floating zone process. In the case of a doped supply rod, the strong axial resistance decrease typical in general for a crucible-pulled material can be corrected and equalized by varying the amount of doping gas added. Due to this method, which is especially suitable for phosphorous doping, an axial variation of resistance can be obtained, which is comparable to a single crystal obtained exclusively by a floating zone process.

The inventive method is particularly suitable for the manufacture of rods having large diameters. Basically, all rod diameters can be used which can be obtained by crucible-pulling. Preferably, polycrystalline silicon rods easily obtainable by crucible-pulling and which have diameters of at least 100 mm are used as supply rods.

In this manner, it is possible to obtain dislocation-free monocrystalline silicon rods having diameters of 100 to 125 mm and greater by only a single floating zone pass, starting from a single polycrystalline rod. These have a significant improved axial variation of resistance, compared to material which is exclusively crucible-pulled, and also contain less oxygen. Further advantage of the inventive method are the shorter processing times for each respective deposition, crucible-pulling and floating zone process or step and the ability to utilize waste material obtained during the floating zone process, as compared to the process of gas-phase deposition followed by two floating zone passes processes or steps.

The invention will now be explained more fully by way of an example which is, however, only given by way of illustration and not of limitation.

EXAMPLE

In a commercially-available apparatus for crucible pulling according to Czochralski, about 26 kg of coarse-grained undoped silicon obtained by vapor deposition of trichlorosilane was melted. From the melt, and following seeding with a polycrystalline seed crystal (diameter 6 mm, length 50 mm) a polycrystalline rod (diameter about 100 mm, drawing velocity about 2 mm/min.) was pulled. At the end of the pulling process, the pulling velocity was reduced for a short time period, so as to thicken the rod end in a bulge-like manner.

The so-obtained polycrystalline rod was cut at both ends to the required length (weight now about 24.6 kg) and was subsequently attached, with the bulge pointing upwardly, to the pulling shaft of a commercially-available floating zone apparatus for the manufacture of monocrystalline semiconductor rods. Subsequently, the receiver or chamber was evacuated with the aid of a commercially-available vacuum pump, and filled with a hydrogen-argon gas mixture up to a total pressure of 1.5 bars. Following application of a seed crystal, a small melting zone generated by means of an induction heating coil was passed at a velocity of 3 mm/min. through the entire length of the rod.

A silicon monocrystalline rod free of any dislocations and having a 100 mm diameter was obtained. Crystal faults or defects could not be detected by either etching or x-ray techniques.

While only one example of the present invention has been described, it is obvious that many changes and modifications may be made thereunto, without departing from the spirit and scope of the invention.

What is claimed is:

1. In a method for the manufacture of a dislocation-free monocrystalline silicon rod by a crucible-free float zoning of a polycrystalline silicon supply rod, the improvement comprising the step of using a Czochralski grown polycrystalline silicon rod as the supply rod, subjecting it to a single floating zone pass, whereby a dislocation-free monocrystalline rod is obtained, and wherein the cross-sectional surface of the polycrystalline rod is substantially composed of monocrystalline regions comprising less than about ⅓ of the entire cross-sectional surface.

2. The method of claim 1, wherein the diameter of said supply rod is so selected that it differs by at most 20% from that of the desired monocrystalline rod.

3. The method of claim 1, additionally including the step of forming a bulge on one end of said polycrystalline supply rod.

4. The method of claim 1, wherein said supply rod has a diameter of at least 100 mm.

5. The method of claim 1, wherein said supply rod was pulled at a speed of 1.5 to 2.5 mm/min.

6. The method according to claim 1, wherein said polycrystalline silicon rod is produced from polycrystalline silicon obtained by vapor deposition of trichlorosilane on a heated carrier element, waste pieces of floating zone produced silicon rods, and a combination thereof.

* * * * *